(12) United States Patent
Yamawaku et al.

(10) Patent No.: US 10,937,631 B2
(45) Date of Patent: Mar. 2, 2021

(54) PLASMA PROCESSING APPARATUS AND PLASMA PROCESSING METHOD

(71) Applicant: TOKYO ELECTRON LIMITED, Tokyo (JP)

(72) Inventors: Jun Yamawaku, Yamanashi (JP); Tatsuo Matsudo, Yamanashi (JP); Chishio Koshimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 59 days.

(21) Appl. No.: 16/214,567

(22) Filed: Dec. 10, 2018

(65) Prior Publication Data

US 2019/0108975 A1    Apr. 11, 2019

Related U.S. Application Data

(62) Division of application No. 14/934,066, filed on Nov. 5, 2015, now abandoned.

(30) Foreign Application Priority Data

Nov. 5, 2014  (JP) .............................. JP2014-225519

(51) Int. Cl.
*C23C 16/00* (2006.01)
*H01L 21/306* (2006.01)
*H01J 37/32* (2006.01)

(52) U.S. Cl.
CPC ..... *H01J 37/3211* (2013.01); *H01J 37/32183* (2013.01); *H01J 37/32651* (2013.01); *H01J 2237/334* (2013.01)

(58) Field of Classification Search
CPC ................ H01J 37/321; H01J 37/3211; H01J 37/32119; H01J 37/32128;
(Continued)

(56) References Cited

U.S. PATENT DOCUMENTS 5,241,245 A    8/1993  Barnes et al.
5,401,350 A *  3/1995  Patrick .................. H01J 37/321
                                                            118/723 I
(Continued)

FOREIGN PATENT DOCUMENTS

JP    H08-017799 A    1/1996
JP    2613002 B2      5/1997
(Continued)

OTHER PUBLICATIONS

United States Office Action, U.S. Appl. No. 14/934,066, dated Jul. 10, 2018, 18 pages.
(Continued)

*Primary Examiner* — Luz L Alejandro Mulero
(74) *Attorney, Agent, or Firm* — Fenwick & West LLP

(57) ABSTRACT

A plasma processing apparatus includes a high frequency antenna having first and second antenna elements. One end of the first antenna element is grounded and the other end thereof is connected to a high frequency power supply. One end of the second antenna element is an open end and the other end thereof is connected to either one of the one end and the other end of the first antenna element, a line length of the second antenna element having a value obtained by multiplying $((\lambda/4)+n\lambda/2)$ by a fractional shortening ($\lambda$ is a wavelength of high frequency in vacuum and n is a natural number). A circuit viewed from the high frequency power supply toward the high frequency antenna is configured to generate, when a frequency of a high frequency power is changed, two resonant frequencies by an adjustment of the impedance adjustment unit.

12 Claims, 8 Drawing Sheets

(58) Field of Classification Search
CPC .......... H01J 37/32137; H01J 37/32146; H01J 37/32155; H01J 37/32165; H01J 37/32174; H01J 37/32183
See application file for complete search history.

(56) References Cited

U.S. PATENT DOCUMENTS

| | | | |
|---|---|---|---|
| 6,441,555 B1* | 8/2002 | Howald | H01J 37/321 118/723 I |
| 2008/0122367 A1* | 5/2008 | Vinogradov | H01J 37/321 315/111.21 |
| 2010/0269980 A1 | 10/2010 | Nishimura et al. | |
| 2011/0233170 A1* | 9/2011 | Yamazawa | H01J 37/32174 216/67 |
| 2014/0106573 A1 | 4/2014 | Terasaki et al. | |

FOREIGN PATENT DOCUMENTS

| | | |
|---|---|---|
| JP | 1997-293600 A | 11/1997 |
| JP | 4178775 B2 | 11/2008 |
| JP | 2010-153274 A | 7/2010 |
| JP | 2010-258324 A | 11/2010 |
| JP | 2014-075579 A | 4/2014 |

OTHER PUBLICATIONS

United States Office Action, U.S. Appl. No. 14/934,066, dated Sep. 14, 2017, 15 pages.
United States Office Action, U.S. Appl. No. 14/934,066, dated Apr. 7, 2017, 12 pages.
United States Office Action, U.S. Appl. No. 14/934,066, dated Nov. 17, 2016, 12 pages.

* cited by examiner

TEST EXAMPLE 2-1

TEST EXAMPLE 2-2

TEST EXAMPLE 2-3

TEST EXAMPLE 2-4

PLASMA PROCESSING APPARATUS AND PLASMA PROCESSING METHOD

CROSS-REFERENCE TO RELATED APPLICATIONS

This application is a divisional application of the co-pending U.S. patent application Ser. No. 14/934,066 filed on Nov. 5, 2015, which claims priority to Japanese Patent Application No. 2014-225519 filed on Nov. 5, 2014. The entire contents of the foregoing applications are incorporated herein by reference for all purposes.

FIELD OF THE INVENTION

The present invention relates to a plasma processing apparatus and a plasma processing method which perform a process on a substrate by exciting a processing gas.

BACKGROUND OF THE INVENTION

As one of the semiconductor manufacturing processes, there is a plasma process such as an etching process, a film forming process or the like which uses plasma of a reaction gas. For example, in a single-substrate plasma processing apparatus, it is required to properly control the plasma density distribution to become appropriate in a plane direction of a substrate depening on a process type, specifically based on a structure in a processing chamber or in consideration of in-plane deviation of the substrate in a post-process. Therefore, the requirement is not limited to making the plasma density distribution uniform in the entire surface of the substrate and may include making the plasma density distribution different between a central portion and a peripheral portion of the substrate.

As one of the plasma generating method in the plasma processing apparatus, there is a method in which, e.g., a high frequency power is supplied to an antenna and an induced electric field generated in a processing chamber to excite a processing gas. For example, Japanese Patent No. 4178775 discloses a method in which a coil corresponding to a monopole antenna is provided around a reaction vessel of a vertical type furnace so as to surround the processing chamber, and an induced electric field is generated in the processing chamber to excite a processing gas and generate plasma. This configuration may make easy the adjustment of the plasma density in an arrangement direction of substrates but is not suitable for the adjustment of the plasma density in the surface of each substrate.

Japanese Patent Application Publication No. 2010-258324 discloses a configuration in which a coil-shaped inner antenna and a coil-shaped outer antenna formed concentric to the inner antenna are provided as a high frequency antenna which outputs a high frequency, and each of antennas resonates at a frequency of ½ wavelength of the high frequency. In this plasma processing apparatus, a circular electric field is formed by each antenna, and thus in-plane distribution of the plasma density can be very finely adjusted. However, a high frequency power supply needs to be provided at each of the inner antenna and the outer antenna.

Japanese Patent Application Publication No. 2014-075579 discloses a plasma processing apparatus in which a monopole antenna surrounds around a processing chamber. Japanese Patent No. 2613002 discloses a technique in which a semiconductor wafer is effectively processed by increasing the plasma density. Japanese Patent Application Publication No. H08-017799 discloses a plasma processing apparatus in which an impedance element is connected between a substrate holder and an earth. However, the above documents all do not achieve the object of the present invention.

SUMMARY OF THE INVENTION

In view of the above, the present invention provides a technique capable of adjusting in-plane distribution of the plasma density in a plasma processing apparatus which performs a process on a substrate by generating plasma by using a high frequency antenna.

In accordance with an aspect, there is provided a plasma processing apparatus for performing a process on a substrate mounted on a mounting unit in a processing chamber of a vacuum atmosphere by exciting a processing gas supplied into the processing chamber and generating plasma, the plasma processing apparatus including: a high frequency antenna formed of a vortex coil arranged opposite to a processing target surface of the substrate mounted on the mounting unit, the high frequency antenna being connected to a high frequency power supply that is a variable frequency power supply and including a first antenna element and a second antenna element; an impedance adjustment unit including variable-capacity capacitors for adjusting a resonant frequency of a circuit viewed from the high frequency power supply toward the high frequency antenna; a dielectric configured to airtightly isolate a vacuum atmosphere in the processing chamber from a space in which the high frequency antenna is arranged; and a shield member configured to surround the space in which the high frequency antenna is arranged.

One end of the first antenna element is grounded and the other end thereof is connected to the high frequency power supply.

One end of the second antenna element is an open end and the other end thereof is connected to either one of the one end of the first antenna element and the other end of the first antenna element, a line length of the second antenna element having a value obtained by multiplying $((\lambda/4)+n\lambda/2)$ by a fractional shortening, where $\lambda$ is a wavelength of high frequency in vacuum and n is a natural number, and the second antenna element being set to resonate at a power frequency to be used.

The circuit viewed from the high frequency power supply toward the high frequency antenna is configured to generate, when a frequency of a high frequency power is changed, a first resonant frequency and a second resonant frequency by an adjustment of the impedance adjustment unit.

In accordance with another aspect, there is provided a plasma processing method using the plasma processing apparatus described above. The plasma processing method including: supplying, from the high frequency power supply to the high frequency antenna, a high frequency power having a frequency between the first resonant frequency and the second resonant frequency; and performing a plasma-process on the substrate.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with respect to the accompanying drawings.

Figure 1:
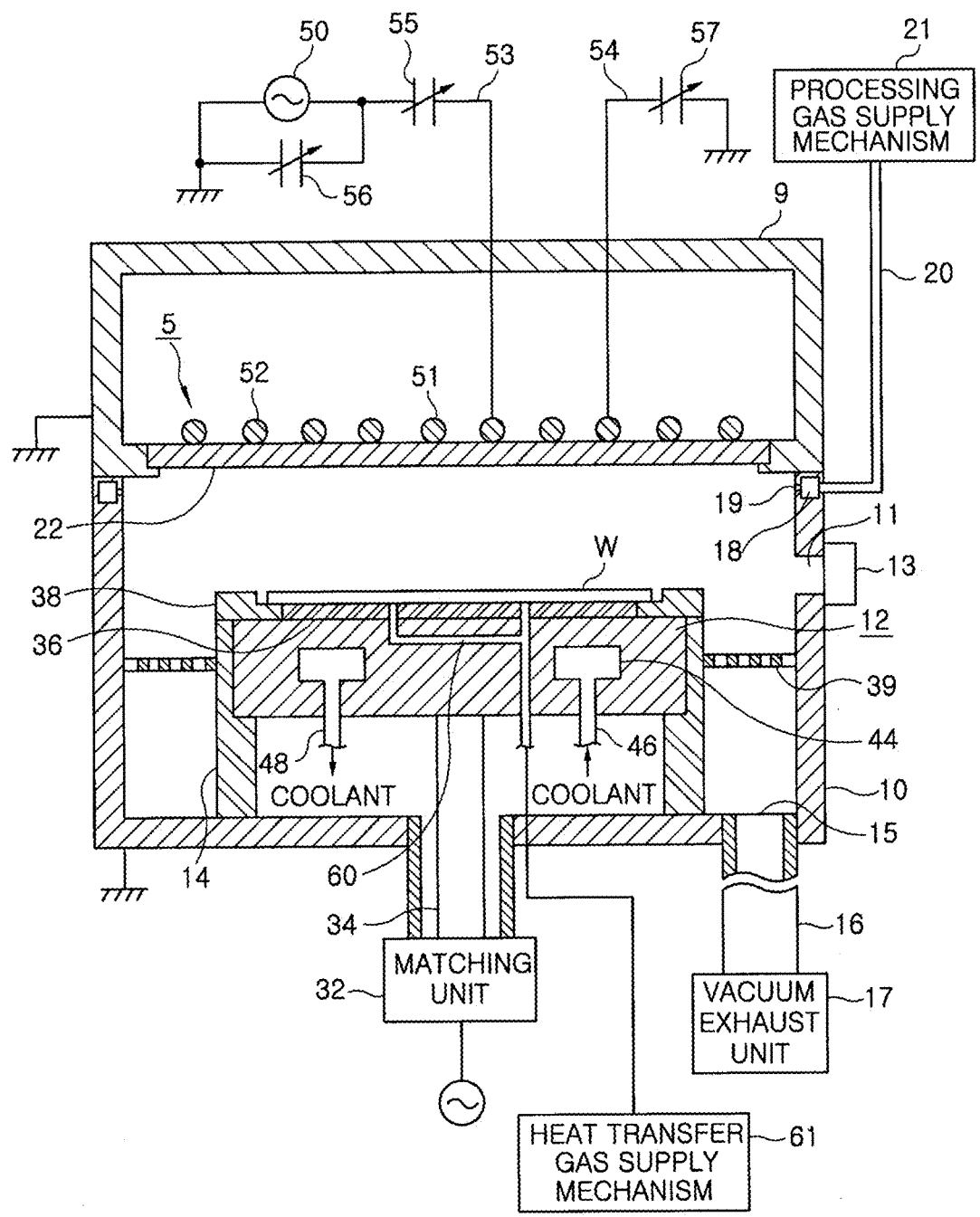
FIG. 1 is a cross sectional view showing a plasma processing apparatus in accordance with an embodiment of the present invention.

A plasma processing apparatus in accordance with an embodiment of the present invention will be described. As shown in FIG. 1, a plasma processing apparatus is a plasma etching apparatus using a radio frequency (RF) (high frequency) antenna formed of a vortex coil, e.g., a plane-shaped vortex coil. The plasma processing apparatus includes a grounded processing chamber 10 made of, e.g., aluminum or stainless steel. A loading/unloading port 11 for loading and unloading a semiconductor wafer (hereinafter, referred to as "wafer") W as a substrate to be processed is installed at a sidewall of the processing chamber 10. A gate valve 13 for opening and closing the loading/unloading port 11 is provided at the loading/unloading port 11.

A cylindrical susceptor 12 serving as a mounting unit on which the wafer W as a substrate to be processed is mounted and also serving as a high frequency electrode is installed at a central portion of the bottom wall of the processing chamber 10 through a support unit 14 formed of an insulator. A high frequency power supply 30 for RF bias is electrically connected to the susceptor 12 through a matching unit 32 and a power feed rod 34. The high frequency power supply 30 is capable of outputting a high frequency power of a specific frequency (13.56 MHz or below) suitable to control energy of ions attracted to the wafer W. The matching unit 32 is formed of a variable reactance matching circuit for making a matching between impedance on the side of the high frequency power supply 30 and impedance on the side of loads (mainly, the susceptor, the plasma and the processing chamber).

An electrostatic chuck 36 for holding the wafer W with an electrostatic attractive force is installed on the top of the susceptor 12. A focus ring 38 which annularly surrounds the periphery of the wafer W is arranged at the outer side of the electrostatic chuck 36 in a diametric direction thereof. In the susceptor 12, an annular coolant path 44 is provided to extend in, e.g., a circumferential direction. A coolant, e.g., a cooling water of predetermined temperature is circularly supplied to the coolant path 44 through lines 46 and 48 from a chiller unit (not shown). A process temperature of the wafer W on the electrostatic chuck 36 can be controlled by the temperature of the coolant. One end of a gas supply line 60 provided in the susceptor 12 is opened at the top surface of the electrostatic chuck 36. The other end of the gas supply line 60 is connected to a heat transfer gas supply mechanism 61 for supplying a heat transfer gas, e.g., He gas between the top surface of the electrostatic chuck 36 and the backside of the wafer W.

In the susceptor 12, elevating pins (not shown) for transferring and receiving the wafer W to and from an external transfer arm is provided to vertically penetrate through the susceptor 12 and protrude beyond and retract below the surface of the electrostatic chuck 36.

A gap between the periphery of the susceptor 12 and an inner wall surface of the processing chamber 10 is blocked by an annular baffle plate 39 formed of a perforated plate. At the bottom wall of the processing chamber 10, an exhaust port 15 is formed below the baffle plate 39. A vacuum exhaust unit 17 is connected to the exhaust port 15 through an exhaust line 16.

In the sidewall of the processing chamber 10, an annular processing gas supply passageway 18 is formed, above the loading/unloading port 11, along the entire circumference of the sidewall. A plurality of processing gas supply ports 19 is formed to be opened toward the inside of the processing chamber 10 along the inner circumference of the processing gas supply passageway 18. A processing gas supply mechanism 21 for supplying a processing gas is connected to the processing gas supply passageway 16 through a gas supply line 20. In case that the plasma processing apparatus is, e.g., an etching apparatus, an etching gas such as $ClF_3$, $F_2$ or the like is used as the processing gas. Further, in case that the plasma processing apparatus is, e.g., a film forming apparatus, a nitriding or oxidizing gas such as ammonia gas, ozone gas or the like is used as the processing gas.

At a ceiling plate part of the processing chamber 10, a dielectric window 22 formed of, e.g., quartz plate is installed to face the electrostatic chuck 36 so as to airtightly isolate the vacuum atmosphere in the processing chamber 10 from the atmospheric atmosphere above the dielectric window 22. At the top surface of the dielectric window 22, a high frequency antenna 5 formed of a vortex-shaped planar coil is provided opposite to the top surface of the susceptor 12 with the dielectric window 22 therebetween. In this example, the high frequency antenna 5 is mounted on the dielectric window 22. A space in which the high frequency antenna 5 is arranged is surrounded by a shield box 9 that is a grounded shield member.

Figure 2:
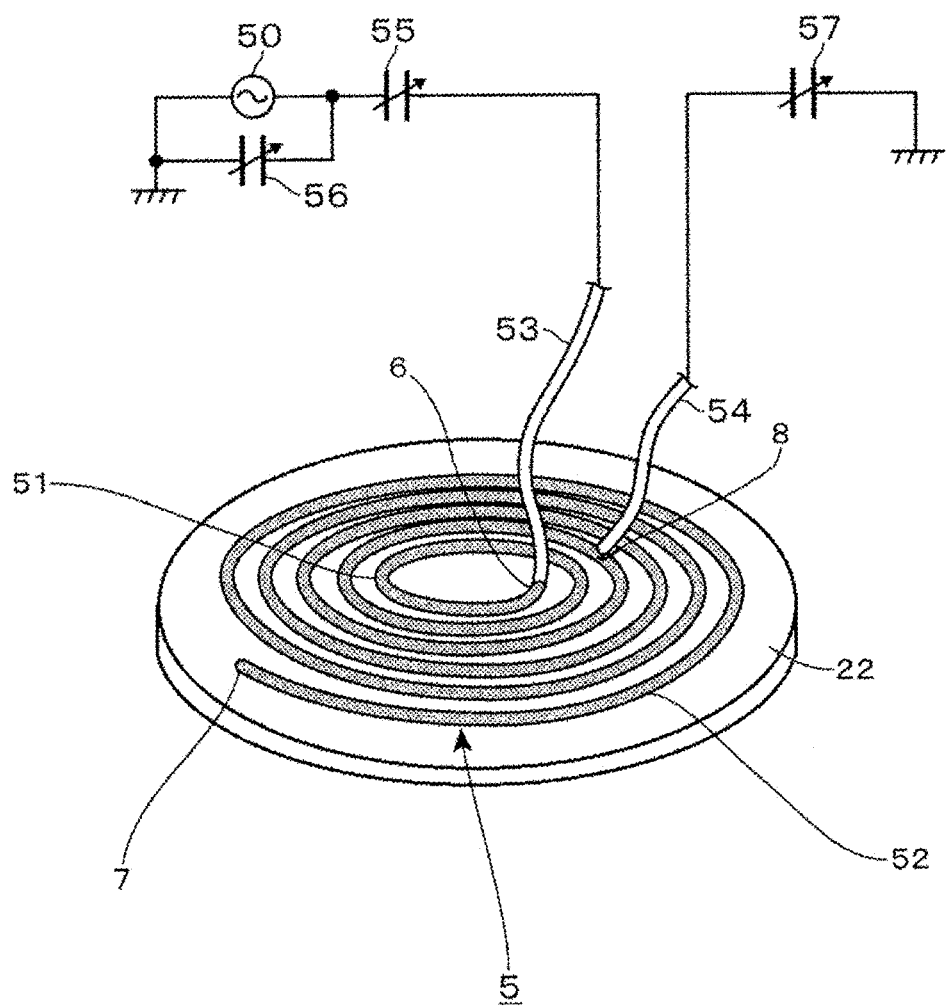
FIG. 2 is a perspective view showing a high frequency antenna in the plasma processing apparatus.

Also referring to FIG. 2, a high frequency power supply 50 that is a variable frequency power supply is connected to an inner end 6 of the high frequency antenna 5 through a wiring 53. On the wiring 53 between the high frequency power supply 50 and the inner end 6 of the high frequency antenna 5, a first variable-capacity capacitor 55 is provided in series to the high frequency power supply 50. Between a connection point of the high frequency power supply 50 to the first variable-capacity capacitor 55 and an earth electrode, a second variable-capacity capacitor 56 is provided in parallel to the high frequency power supply 50. An outer end 7 of the high frequency antenna 5 is an open end. A portion between the inner end 6 and the outer end 7 (hereinafter, referred to as "middle portion") is grounded through wiring 54 while a third variable-capacity capacitor 57 is provided on the wiring 54. A conductive path is indicated as the wirings 53 and 54 in FIGS. 1 and 2, but specifically, the high frequency antenna 5 and a terminal portion of the shield box 9 are connected to each other by a strap-shaped copperplate in the shield box 9, and a coaxial cable is used in the outside of the shield box 9.

A line length from the inner end 6 of the high frequency antenna 5 to the middle portion 8 thereof is not particularly limited, but is set to a length of, e.g., about 1 mm. A line length from the middle portion 8 of the high frequency antenna 5 to the outer end 7 thereof is set to a length of $((\lambda/4)+n\lambda/2)$ (where n is a natural number, 0, 1, 2, . . . ), e.g., $\lambda/4$ so that a standing wave is generated at the corresponding part to thereby output a large high-frequency energy. Here, $\lambda$ is a wavelength of electromagnetic wave in vacuum. Therefore, in order to specify the line length in the high frequency antenna 5, strictly, a fractional shortening is considered. Accordingly, setting the line length to the length of $((\lambda/4)+n\lambda/2)$ (where n is a natural number, 0, 1, 2, . . . ) strictly means setting the line length to have a value obtained by multiplying $((\lambda/4)+n\lambda/2)$ (where n is a natural number, 0, 1, 2, . . . ) by the fractional shortening. The fractional shortening varies depending on how to wind a vortex coil and the surrounding circumstances at which the high frequency antenna 5 is arranged. In the following description, the expression of "multiplication by the fractional shortening" will be omitted to simplify the description.

That is, the line length from the middle portion 8 of the high frequency antenna 5 to the outer end 7 thereof is a length of $\lambda/4$ and may be set to resonate at a power frequency used. In addition, setting the line length to a length of $\lambda/4$ means, with respect to a high frequency between frequencies of two resonance points to be later described and a high frequency near the frequencies of the two resonance points, setting the line length to a length that is considered to be able to generate an effective standing wave suitable for obtaining a plasma intensity strong enough to process the wafer W, the plasma intensity corresponding to a part from the middle portion 8 to the outer end 7.

In the example, a part from the inner end 6 to the middle portion 8 in the high frequency antenna 5 constitutes a first high frequency antenna element 51 and is regarded as a coil for generating an electric field by electromagnetic induction. A part from the middle portion 8 to the outer end 7 constitutes a second high frequency antenna element 52 and is regarded as a spiral antenna formed of a monopole antenna.

Figure 3:
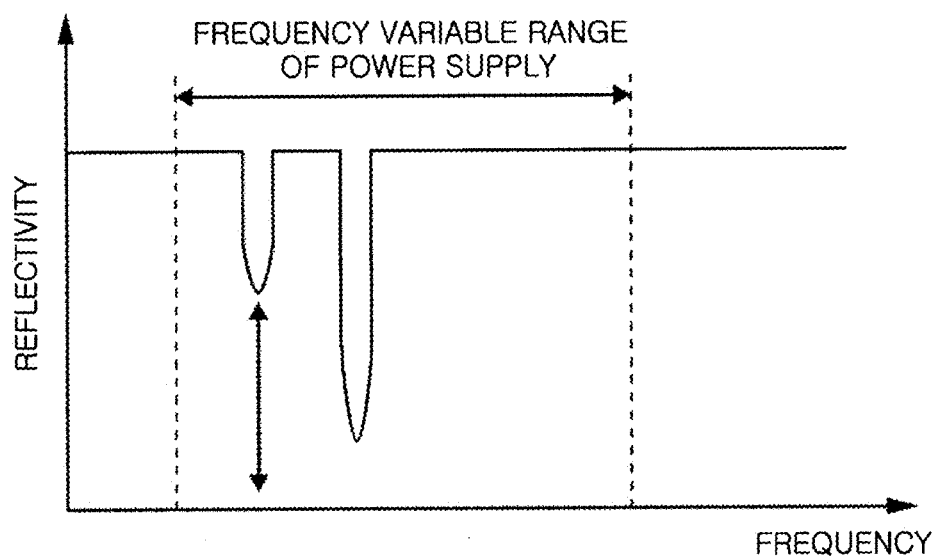
FIG. 3 is a characteristic view showing resonant frequencies generated in the high frequency antenna in accordance with the embodiment of the present invention.

When a circuit including the high frequency antenna 5 is viewed from the high frequency power supply 50, as shown in FIG. 3, two resonant frequencies (resonance points) exist in a frequency variable range of the variable frequency power supply forming the high frequency power supply 50. FIG. 3 schematically shows an example of reflectivity variation when a frequency is changed in the frequency variable range of the high frequency power supply 50 while respective capacities of the first to third variable-capacity capacitors 55 to 57 are fixed to certain values. A reflectivity indicated by an arrow in FIG. 3 can be changed by adjusting the first to third variable-capacity capacitors 55 to 57. By doing so, a relative power balance between a high frequency energy of the first high frequency antenna element 51 and a high frequency energy of the second high frequency antenna element 52 can be controlled.

The first variable-capacity capacitor 55 functions as an impedance matching circuit and corresponds, together with the third variable-capacity capacitor 57, to an impedance adjustment unit for adjusting two resonant frequencies. The two resonant frequencies result from the first high frequency antenna element 51 and the second high frequency antenna element 52, respectively. However, it cannot be found that which resonant frequency comes from the first high frequency antenna element 51 or from the second high frequency antenna element 52.

The second variable-capacity capacitor 56 functions to adjust a reflectivity of when the high frequency antenna 5 is seen from the high frequency power supply 50. By the adjustment of the reflectivity, impedance adjusted by the first and third variable-capacity capacitors 55 and 57 is changed. Therefore, the second variable-capacity capacitor 56 also functions to adjust the resonant frequencies. Accordingly, in this example, the first to third variable-capacity capacitors 55 to 57 may be regarded as the impedance adjustment unit for adjusting the resonant frequencies.

When a distance between the high frequency antenna 5 and the shield box 9 is changed, a capacity therebetween is also changed. Therefore, the first resonant frequency and the second resonant frequency may be adjusted by, e.g., providing a height adjustment mechanism for the high frequency antenna 5 including an elevating mechanism, or providing in the shield box 9 a plate electrically connected to the shield box 9 and changing the height position of the plate. In this example, the height adjustment mechanism of the high frequency antenna 5 and the grounded plate are not provided, so that the resonant frequencies are adjusted by the first variable-capacity capacitor 55 and the third variable-capacity capacitor 57 (or by the first to third variable-capacity capacitors 55 to 57).

As such, since the two resonant frequencies are close to each other, by setting a frequency of the high frequency power supply 50 to a value between the two resonant frequencies, a high frequency energy of the first high frequency antenna element 51 and a high frequency energy of the second high frequency antenna element 52 are distributed depending on a distance (frequency difference) between the set frequency of the high frequency power supply 50 and each of the two resonant frequencies. The two resonant frequencies are adjusted by the first to third variable-capacity capacitors 55 to 57. The first high frequency antenna element 51 and the second high frequency antenna element 52 are respectively arranged at the inner and outer sides on a plane. Accordingly, a plasma density distribution can be adjusted between the periphery of the wafer W and the central portion thereof by the first to third variable-capacity capacitors 55 to 57.

Figure 4:
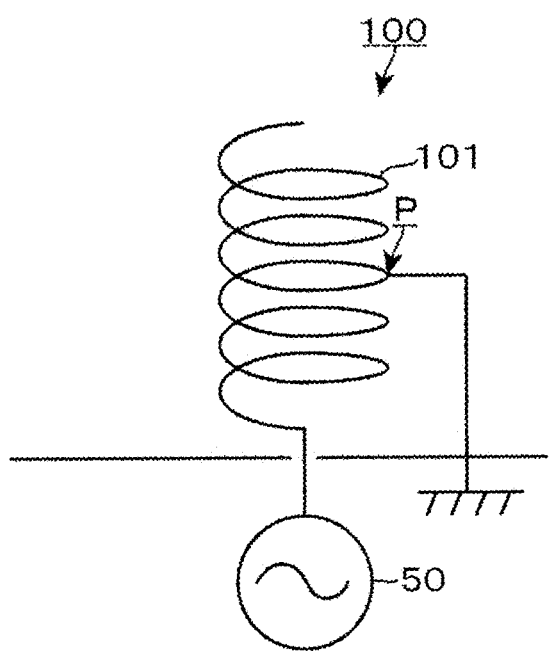
FIG. 4 is an explanatory view showing a monopole antenna.
Figure 5:
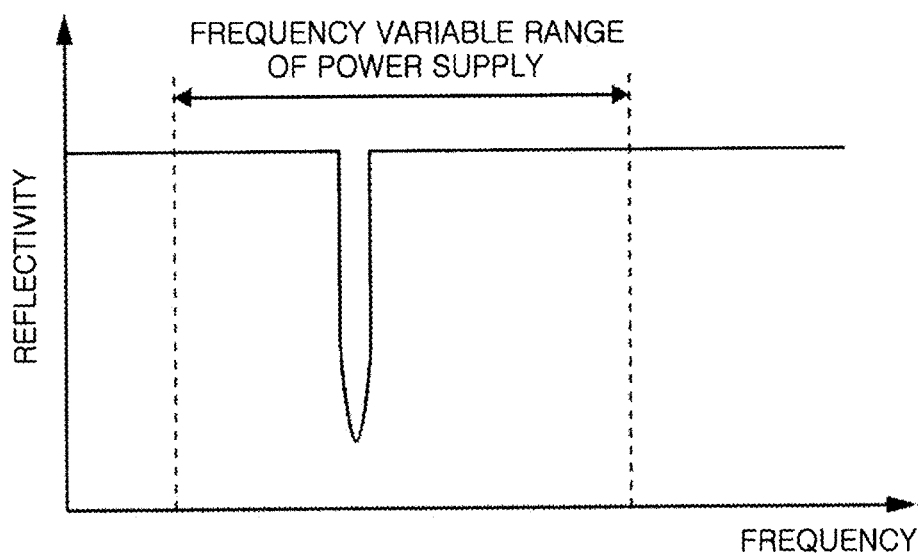
FIG. 5 is a characteristic view showing a resonant frequency generated in the monopole antenna.

Here, referring to a well-known monopole antenna 100 shown in FIG. 4, since a resonant frequency of an open end side from an earthing point P of a middle portion of an antenna element 101 is equal to a resonant frequency of a high frequency power supply side from the earthing point P of the middle portion of the antenna element 101, only one resonant frequency appears, as shown in FIG. 5.

Subsequently, description will be made on an operation of the plasma processing apparatus. In advance, according to a process for the wafer W, resonant frequencies in the high frequency antenna 5 are adjusted by the impedance adjustment unit. In this case, the resonant frequencies may be adjusted while fixing a value of a high frequency used, or both the resonant frequency and the high frequency may be adjusted. From this, a position of a frequency supplied to the high frequency antenna 5 is adjusted between the first resonant frequency and the second resonant frequency.

For example, there may be a desire to make an etching speed or a film forming speed in the periphery of the wafer W higher than that in the central portion of the wafer W, or vice versa. In response to such a demand in each process, in order to obtain a proper plasma density distribution in a plane of the wafer W, a relationship between an adjustment position of each of the variable-capacity capacitors 55 to 57 and in-plane distribution state of the process for the wafer W is previously recognized, and an appropriate adjustment position is found. Specifically, an actuator is provided at the first to third variable-capacity capacitors 55 to 57 to automatically perform a capacity adjustment and an appropriate adjustment position is written in a process recipe. The process recipe is selected by a control unit or is taken from a superior computer and a plasma density distribution is formed according to the process recipe.

If the plasma processing apparatus is operated, the wafer W as a substrate to be processed is mounted on the electrostatic chuck 36 by a cooperative work of the external transfer arm and the elevating pins. Next, after the gate valve 13 is closed, a heat transfer gas is supplied between the electrostatic chuck 36 and the wafer W, and the electrostatic chuck 36 attracts and holds the wafer W. A temperature of the wafer W is set to a setting value by a flow of coolant and the like.

Thereafter, a processing gas is supplied into the processing chamber 10 through the processing gas supply port 19. A vacuum exhaust is performed through the exhaust port 15 and a pressure in the processing chamber 10 is controlled to a predetermined value. Next, the high frequency power supply 50 is turned on to input a high frequency power to the high frequency antenna 5. Further, the high frequency power supply 30 for the susceptor 12 is turned on to apply, to the susceptor 12 through the power feed rod 34, a high frequency power for an ion attraction control.

In the processing chamber 10, the processing gas is excited by a magnetic field formed based on an induction coil that is the first high frequency antenna element 51 and a magnetic field formed based on a standing wave of the second high frequency antenna element 52, so that a plasma is generated and the wafer W is processed.

In the above embodiment, the plasma processing apparatus using inductively coupled plasma uses the vortex-shaped high frequency antenna 5 which is configured by combining the first high frequency antenna element 51 and the second high frequency antenna element 52. The inner end 6 of the first high frequency antenna element 51 is connected to the high frequency power supply 50 and the middle portion 8 that is an outer end of the first high frequency antenna element 51 is grounded. The outer end 7 of the second high frequency antenna element 52 is an open end and a line length of the second high frequency antenna element 52 is $\lambda/4$. Further, the first and second resonant frequencies, which respectively correspond to either one of the first and second high frequency antenna elements 51 and 52 in one-to-one correspondence relationship, are adjusted by adjusting the first to third variable-capacity capacitors 55 to 57. Therefore, a ratio of the high frequency energy distributed to the first and second high frequency antenna elements 51 and 52 can be adjusted and thus plasma density distribution in a plane of the wafer W can be adjusted.

Figure 6:
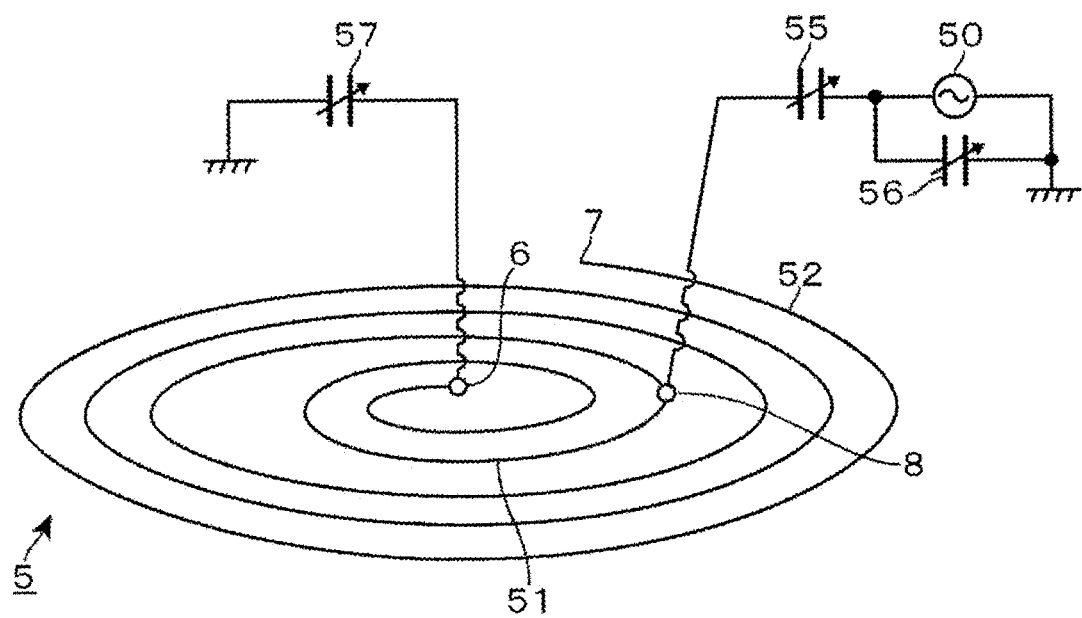
FIG. 6 is an explanatory view showing a high frequency antenna in accordance with another example of the embodiment of the present invention.
Figure 7:
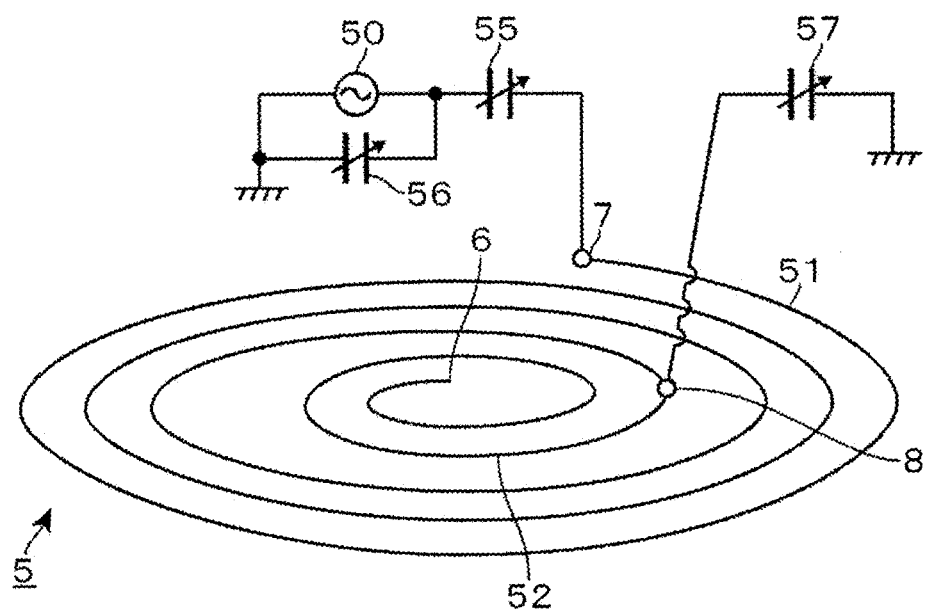
FIG. 7 is an explanatory view showing a high frequency antenna in accordance with still another example of the embodiment of the present invention.

In the plasma processing apparatus in accordance with the embodiment of the present invention, instead of the high frequency antenna 5 shown in FIGS. 1 and 2, as shown in FIG. 6, the inner end 6 of the high frequency antenna 5 may be grounded and the middle portion 8 thereof may be connected to the high frequency power supply 50. Alternatively, as shown in FIG. 7, the high frequency antenna 5 may have a configuration in which the outer end 7 of the high frequency antenna 5 is connected to the high frequency power supply 50, the inner end 6 thereof is an open end, and a line length from the inner end 6 to the middle portion 8 is a length of $(\lambda/4)+n\lambda/2$ (where n is an integer), and the middle portion 8 is grounded. In this example, an inner part from the inner end 6 to the middle portion 8 in the high frequency antenna 5 constitutes the second high frequency antenna element 52 and an outer part from the middle portion 8 to the outer end 7 constitutes the first high frequency antenna element 51.

Figure 8:
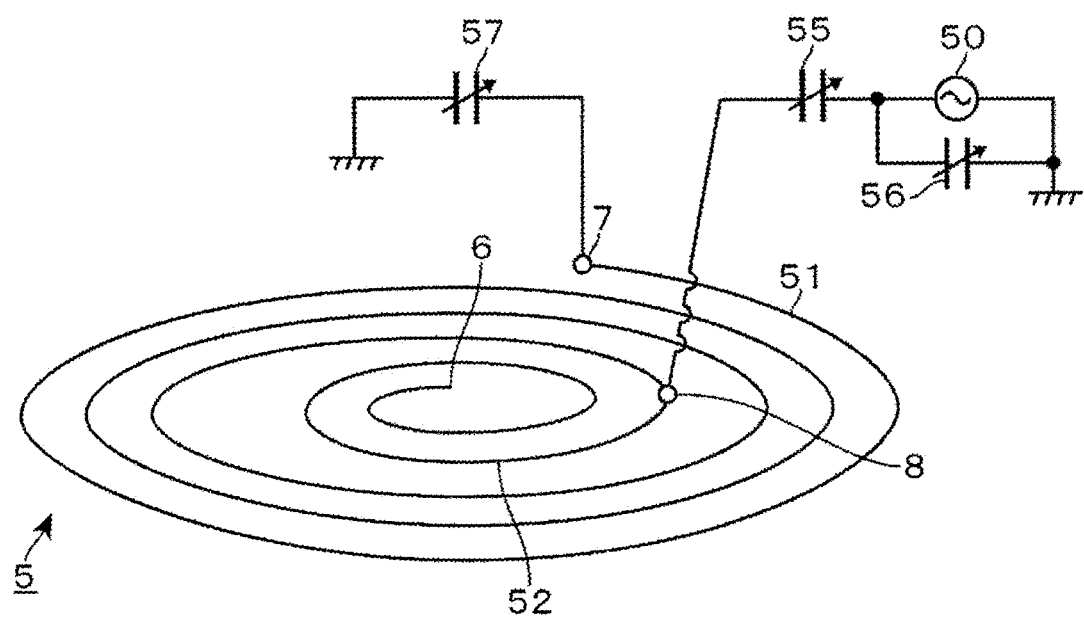
FIG. 8 is an explanatory view showing a high frequency antenna in accordance with yet still another example of the embodiment of the present invention.

Further, in the example in which the inner part constitutes the second high frequency antenna element 52 and the outer part constitutes the first high frequency antenna element 51, as shown in FIG. 8, the outer end 7 may be grounded and the middle portion 8 may be connected to the high frequency power supply 50. In FIGS. 6 to 8, the shield box 9 is omitted in the illustration. That is, the high frequency antenna 5 shown in FIGS. 6 to 8 is accommodated in the shield box 9 as the aforementioned embodiment shown in FIGS. 1 and 2 and is merely different from the high frequency antenna 5 of the aforementioned embodiment with respect to a position connected to the high frequency power supply 50, and a grounded position or a position of the open end.

The vortex coil that is the high frequency antenna 5 is not limited to a plane shape. The central portion of the vortex coil and the peripheral portion thereof may have different height positions while the vortex coil forms a vortex when seen from above.

A winding direction of the high frequency antenna 5 may be a clockwise direction or a counterclockwise direction from the inner end 6 to the outer end 7 when the high frequency antenna 5 is seen from above.

TEST EXAMPLE 1

The following test is performed to confirm the effect of the embodiment of the present invention. The plasma processing apparatus shown in FIG. 1 in accordance with the embodiment of the present invention was used. While changing a frequency of a high frequency power supplied from the high frequency power supply 50 in a range from 10 MHz to 60 MHz, a reflectivity was measured from the high frequency power supply 50 side.

Figure 9:
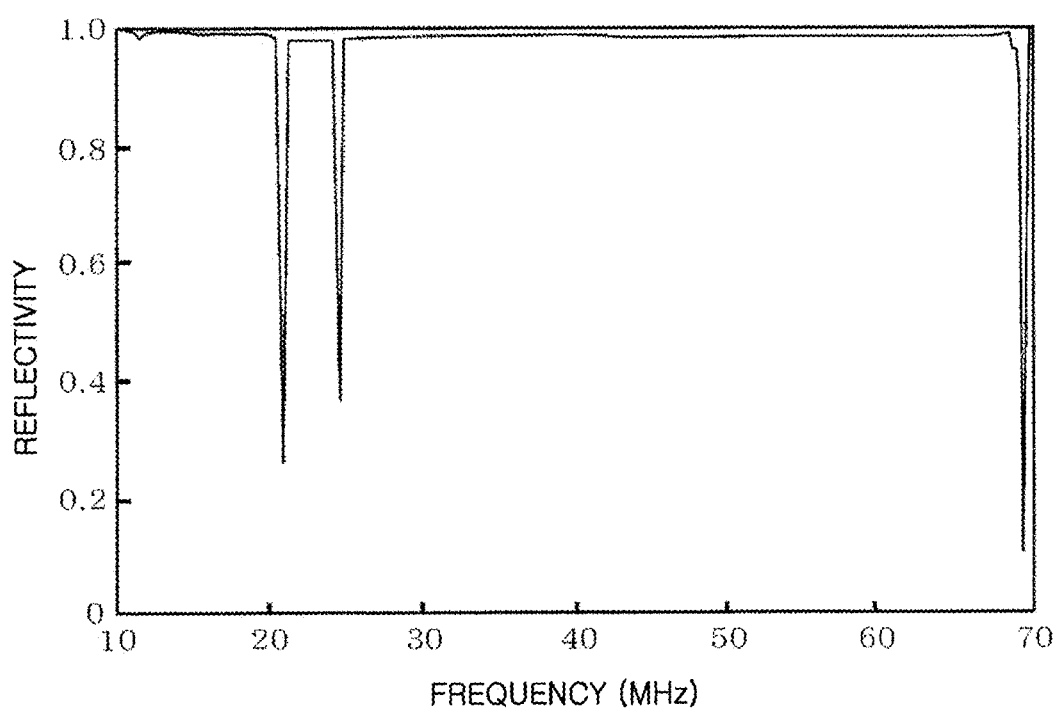
FIG. 9 is a characteristic view showing resonant frequencies in a test example 1.
Figure 10A:
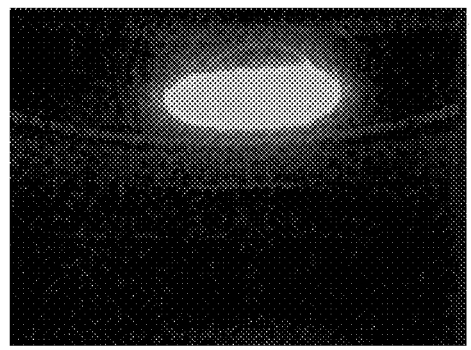
FIGS. 10A to 10D are pictures showing plasma in test examples 2-1 to 2-4.
Figure 10B:
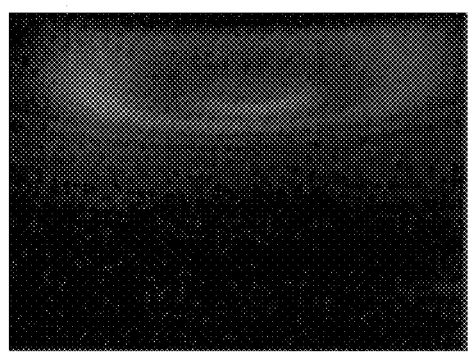
Figure 10C:
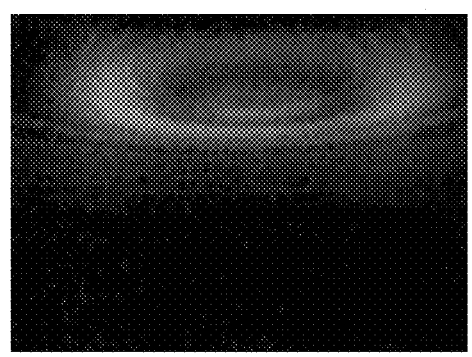
Figure 10D:
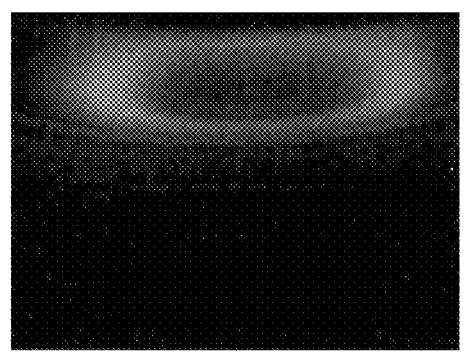

FIG. 9 shows the test result which is a characteristic graph showing a frequency of the high frequency power supply 50 and the reflectivity. According to this result, it is seen that in a frequency variable region of the high frequency power supply 50, the reflectivity is lowered at two frequencies of 22 MHz and 25 MHz. Therefore, it is found that a circuit using the high frequency antenna 5 employed in the plasma processing apparatus of the present embodiment has two resonant frequencies.

TEST EXAMPLE 2

Further, the plasma processing apparatus shown in FIG. 1 in accordance with the embodiment of the present invention was used and a plasma electron density in the processing chamber 10 was measured while changing the capacities of the variable-capacity capacitors 55 to 57. Examples in which the capacities of the variable-capacity capacitors 55 to 57 were adjusted were respectively indicated by test examples 2-1 to 2-4.

Figure 11:
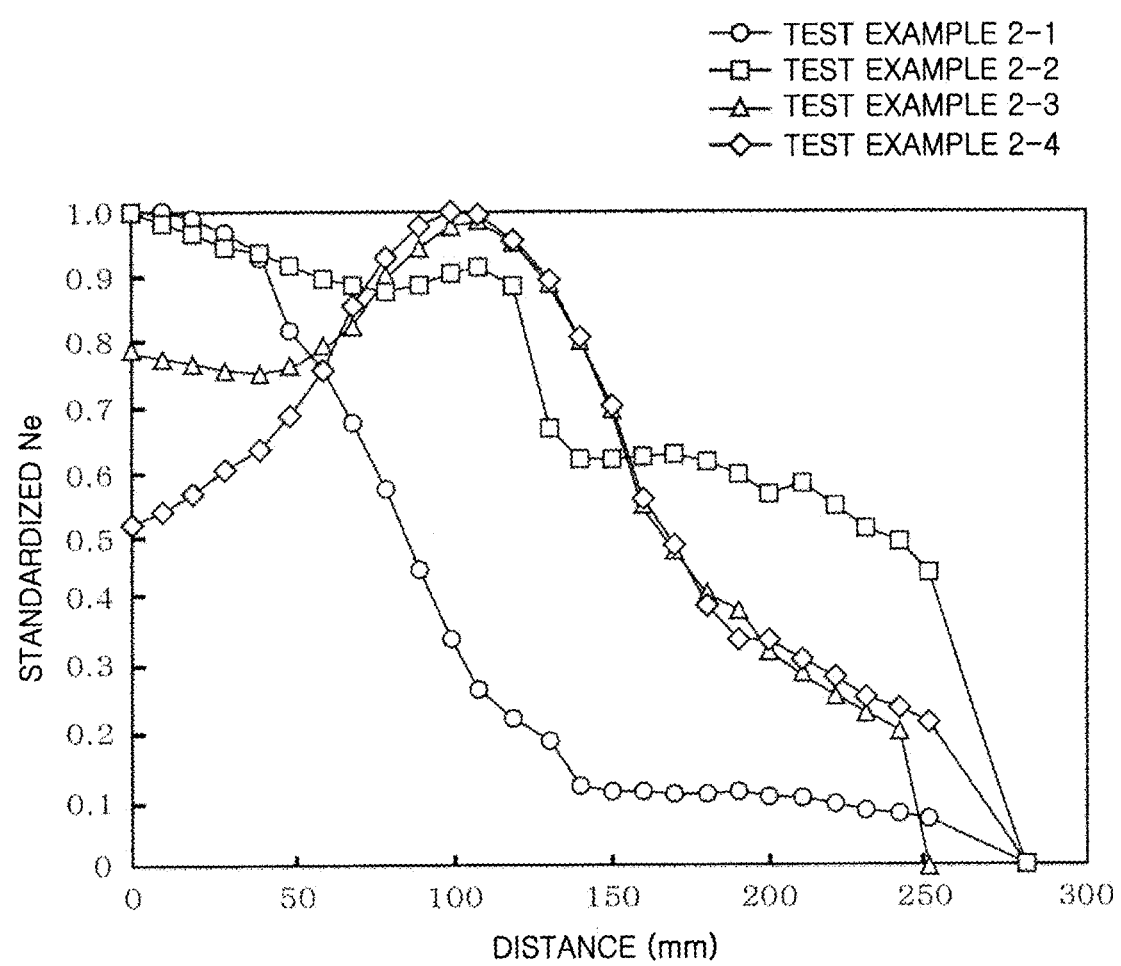
FIG. 11 is a characteristic view showing a standardized plasma density in the test examples 2-1 to 2-4.

FIGS. 10A to 10D are pictures showing excited plasma in the processing chamber 10 in the test examples 2-1 to 2-4, respectively. FIG. 11 shows a characteristic graph in the test examples 2-1 to 2-4 wherein the horizontal axis indicates a distance from a center of the processing chamber 10 and the vertical axis indicates a standardized Ne value which is a value of the electron density Ne standardized by the miximum value NeMax of the electron density Ne. According to this result, in the test example 2-1, the standardized Ne value is high in the central portion, but in the test example 2-2, the standardized Ne value is high in the more outer region compared to the test example 2-1. In the test examples 2-3 and 2-4, the standardized Ne value is highest in an outer position than the center.

According to the result, it is found that in-plane distribution of the plasma density formed in the processing chamber 10 can be changed by changing the capacities of the variable-capacity capacitors 55 to 57.

While the invention has been shown and described with respect to the embodiments, it will be understood by those skilled in the art that various changes and modifications may be made without departing from the scope of the invention as defined in the following claims.

What is claimed is:

1. A plasma processing method using a plasma processing apparatus for performing a process on a substrate mounted on a susceptor in a processing chamber of a vacuum atmosphere by exciting a processing gas supplied into the processing chamber and generating plasma, the plasma processing apparatus comprising:
a variable high frequency power supply;
a high frequency antenna formed of a vortex coil arranged opposite to a processing target surface of the substrate mounted on the susceptor, wherein the high frequency antenna is coupled to the variable high frequency power supply and comprises a first antenna element and a second antenna element; and
an impedance adjustment unit including variable-capacity capacitors configured to adapt capacitances thereof,
wherein one end of the first antenna element is grounded and another end thereof is coupled to the variable high frequency power supply, and
wherein one end of the second antenna element is an open end and another end thereof is coupled to one of the one end of the first antenna element and the another end of the first antenna element,
the plasma processing method comprising:
adjusting the variable-capacity capacitors to cause the high frequency antenna to be resonant at two different frequencies, wherein the two different frequencies comprise a first resonant frequency higher than an output frequency of the variable high frequency power supply and a second resonant frequency lower than the output frequency; and
performing a plasma-process on the substrate.

2. The plasma processing method of claim 1, wherein the variable-capacity capacitors of the impedance adjustment unit include a variable-capacity capacitor coupled between the variable high frequency power supply and the high frequency antenna and coupled in series to the variable high frequency power supply, and a variable-capacity capacitor coupled between the another end of the second antenna element and ground.

3. The plasma processing method of claim 1, wherein the variable-capacity capacitors of the impedance adjustment unit include a variable-capacity capacitor configured to adjust a reflectivity of the high frequency antenna and coupled in parallel to the variable high frequency power supply.

4. The plasma processing method of claim 1, wherein the plasma processing apparatus further comprising:

a dielectric configured to airtightly isolate a vacuum atmosphere in the processing chamber from a space in which the high frequency antenna is arranged; and
a shield member configured to surround the space in which the high frequency antenna is arranged.

5. The plasma processing method of claim 1, wherein a line length of the second antenna element equals to multiplying $((\lambda/4)+n\lambda/2)$ by a fractional shortening, wherein $\lambda$ is a wavelength of high frequency wave in vacuum and n is a natural number.

6. The plasma processing method of claim 1, wherein a line length of the first antenna element is different from the line length of the second antenna element.

7. A plasma processing method using an apparatus comprising a chamber configured to perform a plasma process on a substrate, a variable high frequency power supply, a gas supply configured to supply a process gas into the chamber, a high frequency antenna configured to generate a plasma from the process gas supplied into the chamber, and an impedance adjustment unit including one or more variable capacitors configured to adjust a resonant frequency of the high frequency antenna, the high frequency antenna comprising:
a first antenna element, wherein one end of the first antenna element is grounded and another end thereof is coupled to the variable high frequency, power supply,
a second antenna element, wherein one end of the second antenna element is an open end and another end thereof is coupled to one of the one end of the first antenna element and the another end of the first antenna element,
the plasma processing method comprising:
adjusting the variable capacitors to cause the high frequency antenna to be resonant at two different frequencies, wherein the two different frequencies comprise a first resonant frequency higher than an output frequency of the variable high frequency power supply and a second resonant frequency lower than the output frequency; and
performing a plasma-process on the substrate.

8. The plasma processing method of claim 7, wherein one of the variable capacitors is coupled between the variable high frequency power supply and the high frequency antenna.

9. The plasma processing method of claim 7, wherein one of the variable capacitors is coupled between the high frequency antenna and ground.

10. The plasma processing method of claim 7, wherein one of the variable capacitors is coupled in parallel to the variable high frequency power supply.

11. The plasma processing method of claim 7, wherein a line length of the first antenna element is different from the line length of the second antenna element.

12. The plasma processing method of claim 7, wherein the second antenna element has a line length obtained by multiplying $((\lambda/4)+n\lambda/2)$ by a fractional shortening, wherein $\lambda$ is a wavelength of high frequency wave in vacuum and n is a natural number.

* * * * *